(12) United States Patent
Ogami et al.

(10) Patent No.: US 7,535,152 B2
(45) Date of Patent: May 19, 2009

(54) LAMB WAVE DEVICE

(75) Inventors: Takashi Ogami, Ritto (JP); Kansho Yamamoto, Otsu (JP); Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/099,839

(22) Filed: Apr. 9, 2008

(65) Prior Publication Data

US 2008/0179989 A1 Jul. 31, 2008

Related U.S. Application Data

(63) Continuation of application No. PCT/JP2006/319852, filed on Oct. 4, 2006.

(30) Foreign Application Priority Data

Oct. 19, 2005 (JP) ............................. 2005-304218

(51) Int. Cl.
*H03H 9/25* (2006.01)
(52) U.S. Cl. ............................... 310/313 A; 310/313 R
(58) Field of Classification Search ............. 310/313 R, 310/313 A, 313 B
See application file for complete search history.

(56) References Cited

FOREIGN PATENT DOCUMENTS

| JP | 03-006912 A | 1/1991 | |
|---|---|---|---|
| JP | 2002-152007 | * | 5/2002 |
| JP | 2002-152007 A | | 5/2002 |
| JP | 2003-017969 A | | 1/2003 |
| JP | 2003-309447 A | | 10/2003 |
| JP | 2004-072204 A | | 3/2004 |

OTHER PUBLICATIONS

Official communication issued in counterpart International Application No. PCT/JP2006/319852, mailed on Jan. 23, 2007.

Mizutani et al., "Analysis of Lamb Wave Propagation Characteristics in Rotated Y-Cut X-Propagation LiNbO3 Plates" vol. J68 A, No. 5. pp. 496 503, May 1985.

* cited by examiner

*Primary Examiner*—Thomas M Dougherty
(74) *Attorney, Agent, or Firm*—Keating & Bennett, LLP

(57) ABSTRACT

A Lamb wave device includes a base substrate, a piezoelectric thin film which is provided on the base substrate and which has a floating portion floating above the base substrate, the floating portion having a first surface facing the base substrate and a second surface opposite to the first surface, and an IDT electrode disposed on at least one of the first and the second surfaces of the piezoelectric thin film. The piezoelectric thin film is made of LiTaO$_3$ or LiNbO$_3$, and the c-axis of the piezoelectric thin film is set in approximately the same direction as that of a line substantially perpendicular to the first and the second surfaces of the piezoelectric thin film, and the crystal structure of the piezoelectric thin film is a rotation twin crystal having the c-axis functioning as the rotation axis.

5 Claims, 5 Drawing Sheets

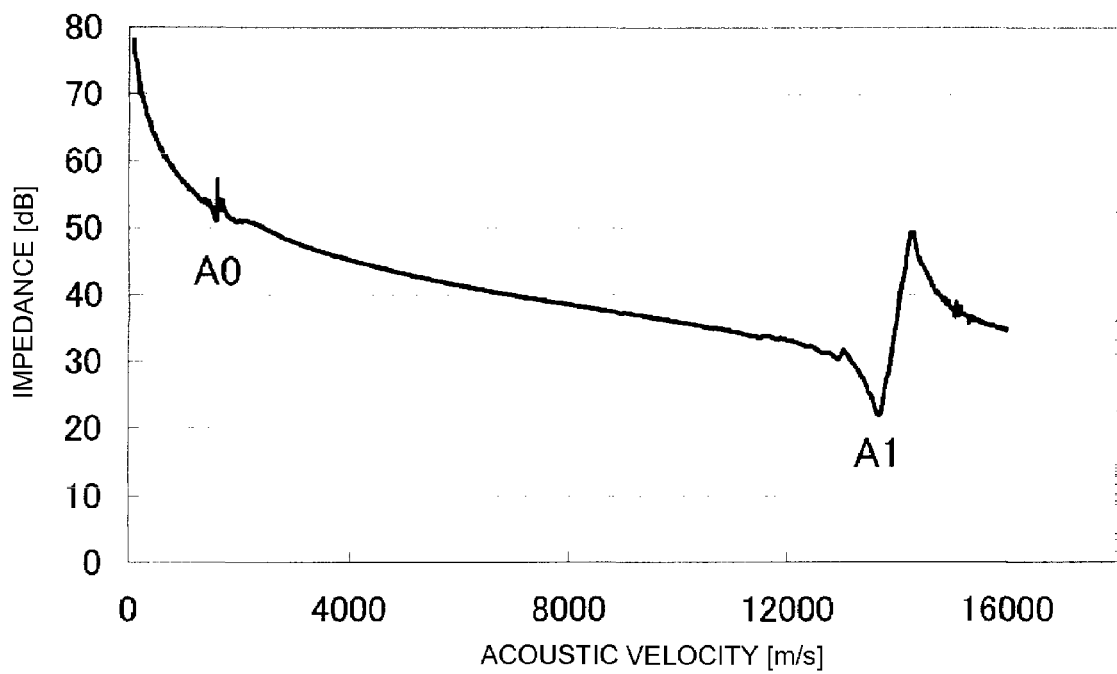
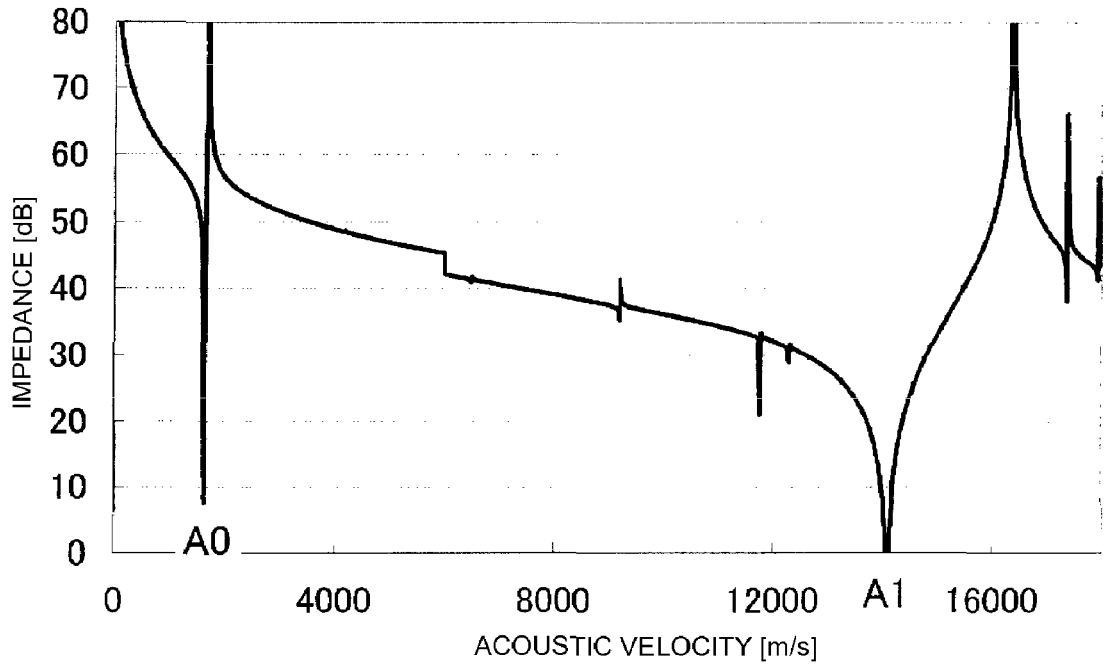

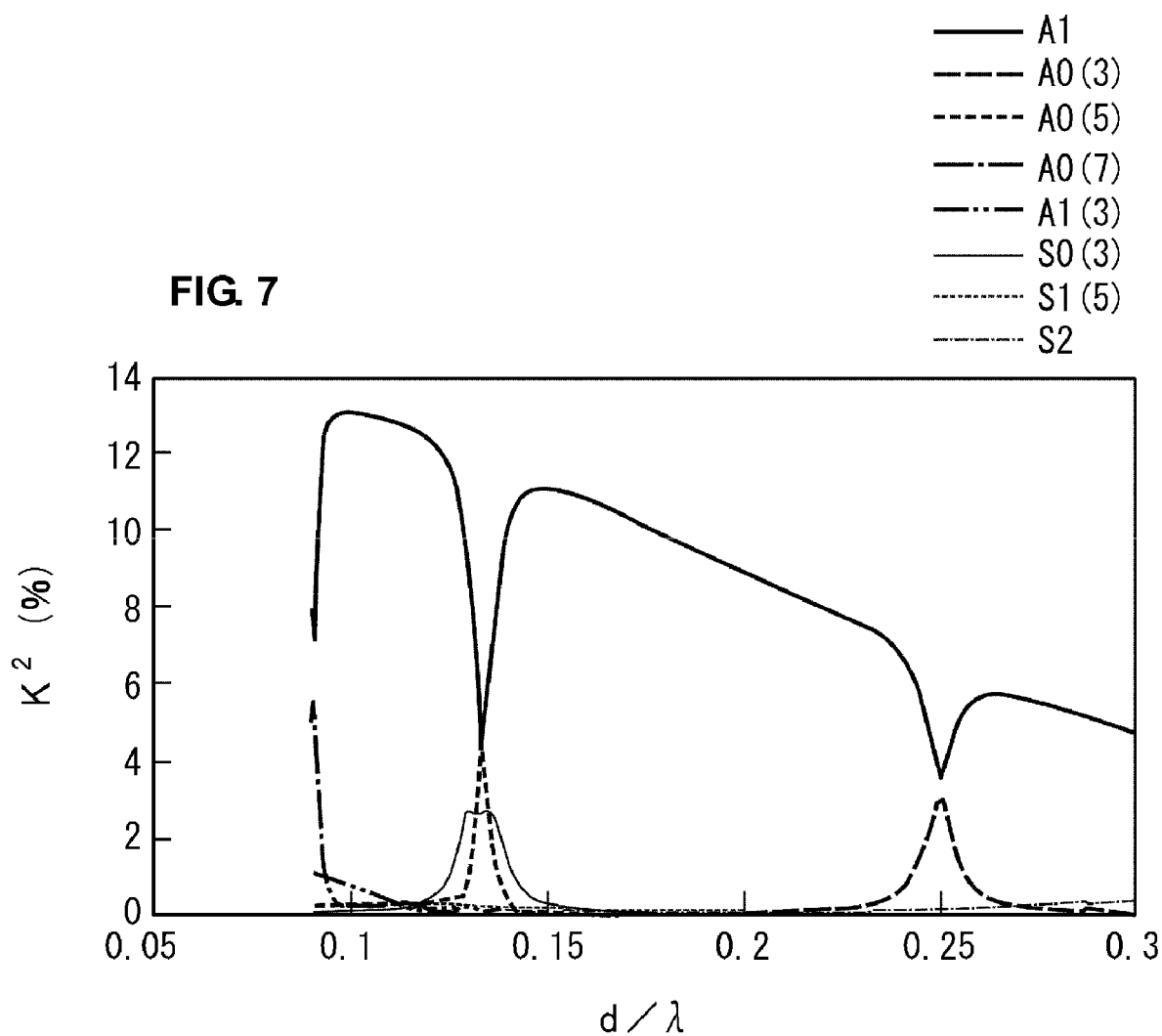

LAMB WAVE DEVICE

BACKGROUND OF THE INVENTION

1. Field of the Invention

The present invention relates to a Lamb wave device using a Lamb wave propagating in a piezoelectric thin film, and more particularly, to a Lamb wave device used as a resonator or a filter.

2. Description of the Related Art

Heretofore, devices using various waves excited using a piezoelectric effect have been proposed and used. Among these devices, devices using a surface acoustic wave, that is, energy that concentrates in the vicinity of a surface of an elastic body and propagates, have been widely used as a resonator, a filter, and other suitable devices.

On the other hand, according to "Analysis of Lamb Wave Propagation Characteristics In Rotated Y-cut X-propagation LiNbO$_3$ Plate" The Journal of the Institute of Electrical Communication Engineers of Japan, 85/5, Vol. J68-A, No. 5, pp. 496-503, a device using a Lamb wave propagating in an elastic body, which is different from a Rayleigh wave, is disclosed. The Lamb wave is one type of bulk wave, that is, one type of plate wave, and is an elastic wave which propagates in a piezoelectric body while reflecting off two primary surfaces thereof when the thickness of the piezoelectric body is equal to or less than the wavelength of the elastic wave. Instead of the Lamb wave, an SH wave is also known. According to "Handbook of Elastic Wave Device Technology" (published in 1991 by Ohm Co., Ltd.), "the mode change of an SV wave and that of a longitudinal wave (compressional wave) occur at two surfaces of a plate, and by complicated coupling therebetween, a plate wave called a Lamb wave is generated."

As disclosed in "Analysis of Lamb Wave Propagation Characteristics In Rotated Y-cut X-propagation LiNbO$_3$ Plate", The Journal of the Institute of Electrical Communication Engineers of Japan, 85/5, Vol. J68-A, No. 5, pp. 496-503, since the Lamb wave, which is an elastic wave, propagates in a plate-shaped piezoelectric body while reflecting off two surfaces of the plate-shaped elastic body, the properties of the Lamb wave are different from those of the Rayleigh wave. In the Lamb wave, since the velocity dispersion properties are present, two surfaces can be used, and thus, the Lamb wave is likely to obtain a larger electromechanical coupling coefficient than that of the Rayleigh wave.

In "Analysis of Lamb Wave Propagation Characteristics In Rotated Y-cut X-propagation LiNbO$_3$ Plate" The Journal of the Institute of Electrical Communication Engineers of Japan, 85/5, Vol. J68-A, No. 5, pp. 496-503, a Lamb wave device using a piezoelectric thin film of 90°-rotated Y-X LiNbO$_3$ is disclosed. In this document, the A1 mode, which is an asymmetric mode having a high acoustic velocity and a large electromechanical coupling coefficient, is excited.

According to the above Lamb wave device disclosed in the "Analysis of Lamb Wave Propagation Characteristics In Rotated Y-cut X-propagation LiNbO$_3$ Plate", The Journal of the Institute of Electrical Communication Engineers of Japan, 85/5, Vol. J68-A, No. 5, pp. 496-503, since the Lamb wave is used in a structure in which an IDT electrode is provided on a piezoelectric thin film, the electromechanical coupling coefficient is likely to be increased. However, when a Lamb wave device as disclosed in "Analysis of Lamb Wave Propagation Characteristics In Rotated Y-cut X-propagation LiNbO$_3$ Plate", The Journal of the Institute of Electrical Communication Engineers of Japan, 85/5, Vol. J68-A, No. 5, pp. 496-503 is made, although a pass band can be obtained in a high frequency region, spurious responses are likely to be generated in the pass band or the attenuation band.

SUMMARY OF THE INVENTION

To overcome the problems described above, preferred embodiments of the present invention provide a Lamb wave device which not only obtains a higher bandwidth by increasing the electromechanical coupling coefficient but also suppresses the influence of undesired spurious responses.

According to preferred embodiments of the present invention, a Lamb wave device is provided which includes a base substrate, a piezoelectric thin film provided on the base substrate and having a floating portion floating above the base substrate, the floating portion having a first surface facing the base substrate and a second surface opposite to the first surface, and an IDT electrode disposed on at least one of the first and the second surfaces of the piezoelectric thin film. The piezoelectric thin film is formed of LiTaO$_3$ or LiNbO$_3$, and the c-axis of the piezoelectric thin film is set in approximately the same direction as that of a perpendicular line to the first and the second surfaces of the piezoelectric thin film, and the crystal structure of the piezoelectric thin film is a rotation twin crystal with the c-axis functioning as the rotation axis.

According to a preferred embodiment of the Lamb wave device of the present invention, the piezoelectric thin film is made of LiNbO$_3$, the IDT electrode is made of Al or an alloy including Al as a primary component, and when the thickness of the IDT electrode is represented by h, the thickness of the piezoelectric thin film is represented by d, and the wavelength of a usage mode of the Lamb wave is represented by λ, h and d satisfy one of the following conditions I to III.

$0.01 \leq h/d \leq 0.24$ and $0.090 \leq d/\lambda \leq 0.107$      I $0.01 \leq h/d \leq 0.24$ and $0.133 \leq d/\lambda \leq 0.233$      II $0.01 \leq h/d \leq 0.24$ and $0.257 \leq d/\lambda \leq 0.300$      III According to another preferred embodiment of the Lamb wave device of the present invention, the piezoelectric thin film is made of LiTaO$_3$, the IDT electrode is made of Al or an alloy including Al as a primary component, and when the thickness of the IDT electrode is represented by h, the thickness of the piezoelectric thin film is represented by d, and the wavelength of a usage mode of the Lamb wave is represented by λ, h and d satisfy one of the following conditions IV to VI.

$0.01 \leq h/d \leq 0.26$ and $0.093 \leq d/\lambda \leq 0.125$      IV $0.01 \leq h/d \leq 0.26$ and $0.141 \leq d/\lambda \leq 0.240$      V $0.01 \leq h/d \leq 0.26$ and $0.260 \leq d/\lambda \leq 0.300$      VI According to another preferred embodiment of the Lamb wave device of the present invention, the IDT electrode is formed on the second surface of the piezoelectric thin film.

In addition, according to another preferred embodiment of the present invention, the IDT electrode is provided on the first surface of the piezoelectric thin film.

In the Lamb wave device according to preferred embodiments of the present invention, since the piezoelectric thin film is made of LiTaO$_3$ or LiNbO$_3$, the c-axis is set in approximately the same direction as that of a perpendicular line to the first and the second surfaces of the piezoelectric thin film, and the crystal structure thereof is a rotation twin crystal, the fundamental mode S0 of the symmetric mode and/or the fundamental mode SH0 of the SH mode is not generated, and out-of-band spurious responses based on these modes are suppressed. Thus, a Lamb wave device having superior frequency properties is provided.

According to preferred embodiments of the present invention, for example, a device having a central frequency of about 2 GHz to about 10 GHz and a fractional band width of about 1% to about 10% can be provided. Furthermore, besides a band-pass filter, the Lamb wave device according to preferred embodiments of the present invention may be applied to various devices, such as a resonator.

In particular, according to preferred embodiments of the present invention, when the piezoelectric thin film is made of $LiNbO_3$, the IDT electrode is made of Al or an alloy including Al as a primary component, and h and d satisfy one of the above conditions I to III, the generation of spurious responses in the vicinity of the pass band is effectively suppressed, and ripples generated in the pass band and spurious responses in the vicinity of the pass band are suppressed.

In addition, when the piezoelectric thin film is made of $LiTaO_3$, the IDT electrode is formed of Al or an alloy containing Al as a primary component, and h and d satisfy one of the above conditions IV to VI, as is the case described above, the generation of spurious responses in the vicinity of the pass band is suppressed, and ripples generated in the pass band and spurious responses in the vicinity of the pass band are effectively suppressed.

When the IDT electrode is formed on the second surface of the piezoelectric thin film, which is a surface opposite to that facing the base substrate, since the IDT electrode can be easily formed on the second surface of the piezoelectric thin film provided on the base substrate, the Lamb wave device can be easily provided.

Furthermore, the IDT electrode may be formed on the first surface of the piezoelectric thin film, and in this case, since the IDT electrode faces the base substrate and is not exposed to the outside, a metal powder generated from a metal material used for an exterior packaging case is not likely to adhere to the IDT electrode. Thus, property defects caused by the adhesion of a metal powder are suppressed, and a Lamb wave device having superior environmental resistance and/or humidity resistance is provided.

Other features, elements, processes, steps, characteristics and advantages of the present invention will become more apparent from the following detailed description of preferred embodiments of the present invention with reference to the attached drawings.

BRIEF DESCRIPTION OF DRAWINGS

FIG. 3A is a view showing the result, which is obtained by actual measurement, of the change in impedance with the acoustic velocity when a $LiNbO_3$ thin film of a Lamb wave device of a preferred embodiment has a twin crystal structure.

FIG. 3B is a view showing the result, which is obtained by simulation, of the change in impedance with the acoustic velocity when a $LiNbO_3$ thin film of a Lamb wave device of a preferred embodiment has a twin crystal structure.

FIG. 7 is a view showing the change in electromechanical coupling coefficient $K^2$ with d/λ of each mode in which in a Lamb wave device of a preferred embodiment of the present invention, the IDT electrode is provided on a $LiTaO_3$ thin film using Al, and the ratio h/d of the thickness d of the electrode to the wavelength λ is set to about 0.26.

DETAILED DESCRIPTION OF PREFERRED EMBODIMENTS

Hereinafter, with reference to the drawings, preferred embodiments of the present invention will be described.

First Preferred Embodiment

Figure 1:
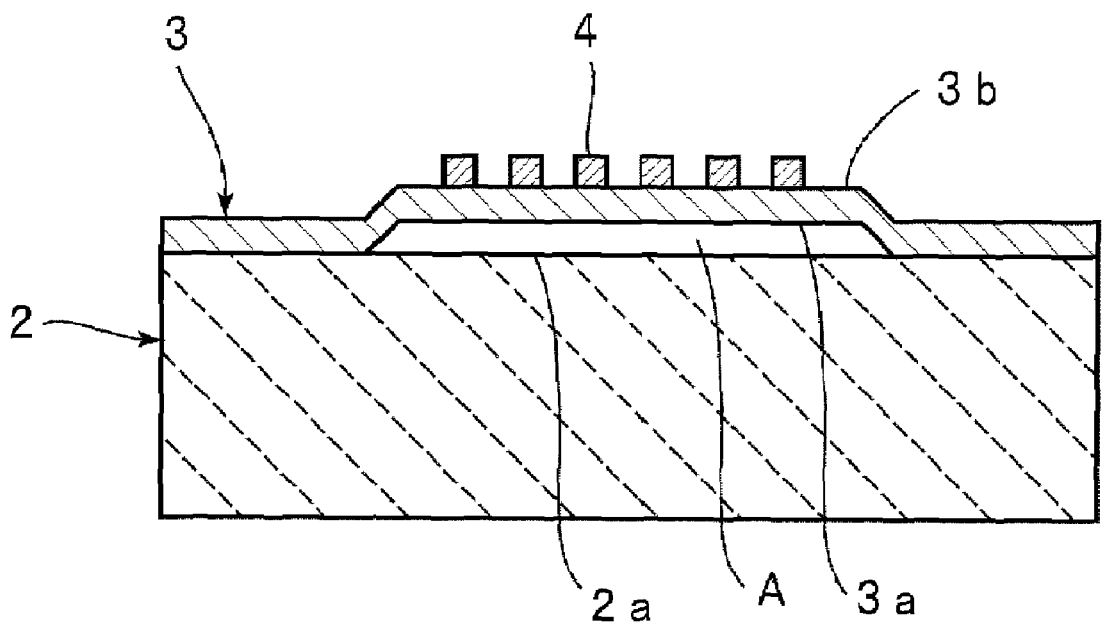
FIG. 1 is a schematic front cross-sectional view of a Lamb wave device according to a preferred embodiment of the present invention.

FIG. 1 is a schematic front cross-sectional view illustrating a Lamb wave device according to a preferred embodiment of the present invention. A Lamb wave device 1 includes a base substrate 2 and a piezoelectric thin film 3 provided thereon. The piezoelectric thin film 3 is disposed on an upper surface 2a of the base substrate 2. However, a floating portion of the piezoelectric thin film 3 is provided above the upper surface 2a of the base substrate 2 with a gap interposed therebetween. At this floating portion, a first surface 3a of the piezoelectric thin film 3 faces the upper surface 2a of the base substrate 2 with the gap interposed therebetween, and an IDT electrode 4 is disposed on a second surface 3b which is an outer surface and which is a surface opposite to the first surface 3a. The IDT electrode 4 is provided to define a desired resonator or filter.

In this preferred embodiment, the base substrate 2 is preferably made of a $LiNbO_3$ single crystal substrate. In addition, the piezoelectric thin film 3 is made of a $LiNbO_3$ thin film, the c-axis of the piezoelectric thin film 3 is set in approximately the same direction as that of a perpendicular line to the first and the second surfaces 3a and 3b of the piezoelectric thin film 3, and the crystal structure of the piezoelectric thin film 3 is a rotation twin crystal having the c-axis functioning as the rotation axis.

By description of a method for manufacturing the Lamb wave device of this preferred embodiment, the above structure will be described in more detail.

First, on the base substrate 2, by a general film formation method, such as sputtering, a ZnO epitaxial film used as an underlying layer is formed so that the c-axis is in a direction substantially perpendicular to the upper surface 2a of the base substrate 2.

A material forming the base substrate 2 is not limited to the above-described material as long as an epitaxial film can be formed thereon so that the c-axis is in a direction substantially perpendicular to the upper surface 2a of the base substrate 2. For example, the base substrate 2 may be formed of another piezoelectric single crystal, such as a $LiTaO_3$ single crystal or sapphire.

After the ZnO epitaxial film used as an underlying layer is patterned in accordance with the planar shape of the floating portion of the piezoelectric thin film 3 to be subsequently formed, by using a CVD film forming apparatus, the piezoelectric thin film 3 is formed. The piezoelectric thin film 3 is made of a $LiNbO_3$ thin film in this preferred embodiment. In addition, instead of the $LiNbO_3$ thin film, a $LiTaO_3$ thin film may also be used.

Since the piezoelectric thin film 3 is formed on the ZnO epitaxial film thus formed as an underlying layer, the c-axis of the piezoelectric thin film 3 is in a direction substantially perpendicular to the upper surface 2a of the base substrate 2, and the piezoelectric thin film 3 formed of $LiNbO_3$ is a twin epitaxial film.

Figure 2:
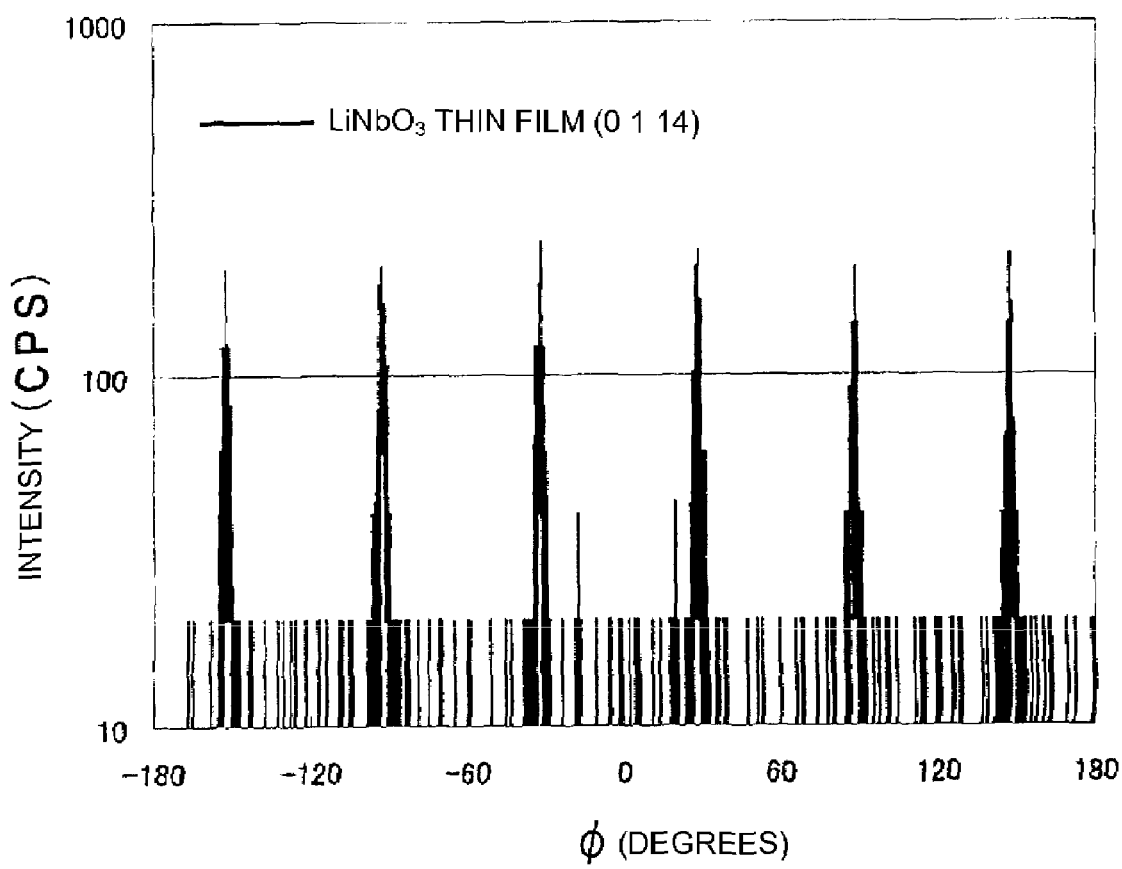
FIG. 2 is a view showing an XRD spectrum of a $LiNbO_3$ thin film provided on a ZnO epitaxial film.

A $LiNbO_3$ single crystal or a $LiTaO_3$ single crystal naturally has 3-fold rotational symmetry around the c-axis. However, after the piezoelectric thin film 3 was formed, when evaluation was performed using XRD, the results shown in FIG. 2 were obtained. That is, as apparent from an XRD spectrum shown in FIG. 2, it was confirmed that an actually formed $LiNbO_3$ thin film has 6-fold rotation symmetry. In addition, it was found that the $LiNbO_3$ film thus formed is a rotation twin epitaxial film.

Since the ZnO epitaxial film used as an underlying layer itself has 6-fold rotation symmetry, it is believed that $LiNbO_3$ or $LiTaO_3$ formed thereon has two orientation directions. As long as a $LiNbO_3$ thin film or a $LiNbO_3$ thin film can be a rotation twin epitaxial film, a material used as an underlayer is not limited to ZnO, and a metal epitaxial film, such as Cu or Pt, may also be used.

Next, by a dry process, such as Ar ion milling or reactive ion etching, etching holes are formed in the $LiNbO_3$ thin film or $LiTaO_3$ thin film. Subsequently, by using a photolithographic and a film forming method, the IDT electrode 4 is formed. Next, the ZnO epitaxial film used as an underlying layer is removed by etching using an acid, and as a result, a space A shown in FIG. 1 is formed.

The Lamb wave device 1 of this preferred embodiment is obtained as described above. The relationship between the acoustic velocity and the impedance of a resonator of the $LiNbO_3$ thin film of the Lamb wave device 1 was measured. The results are shown in FIG. 3A.

In addition, FIG. 3B shows the results, obtained by simulation, of the relationship between the acoustic velocity and the impedance of the $LiNbO_3$ thin film of the Lamb wave device 1, which were obtained by simulation using a finite element method.

Figure 3C:
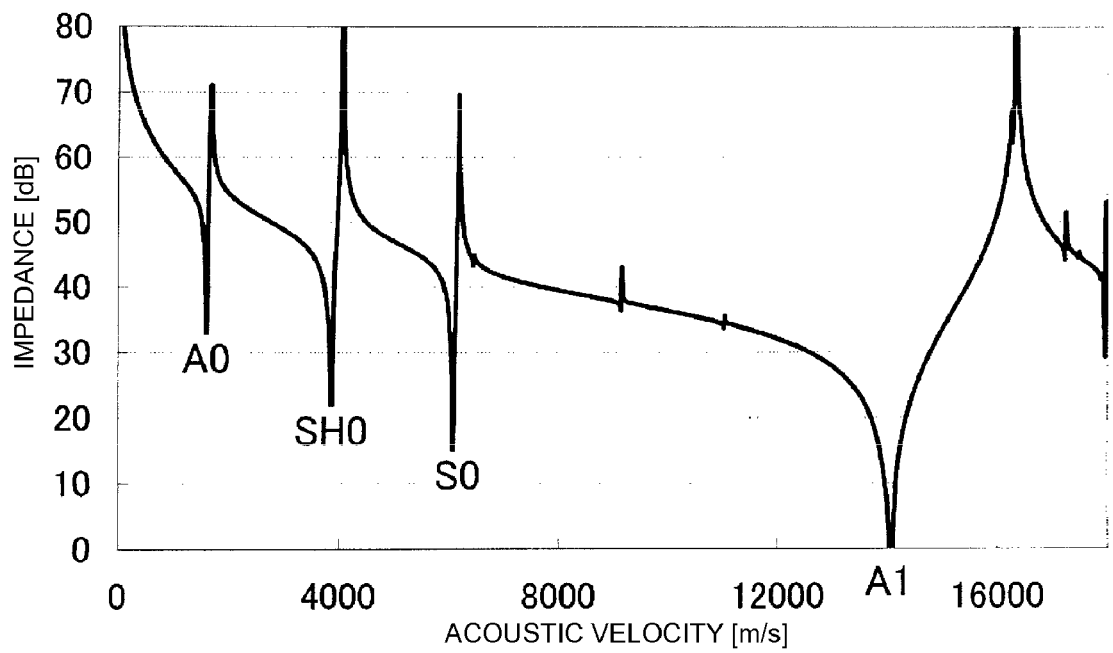
FIG. 3C is a view showing the relationship between the impedance and the acoustic velocity, which is obtained by simulation when a $LiNbO_3$ thin film has a single crystal structure.

In addition, FIG. 3C is a view showing the relationship between the acoustic velocity and the impedance of the structure of a comparative example having the same configuration as described above except that a $LiNbO_3$ thin film of the Lamb wave device 1 does not have a twin crystal structure but is a single crystal, which is obtained by simulation.

As shown in FIG. 3C, it is found that when the $LiNbO_3$ thin film is a single crystal, intense responses by the fundamental mode SH0 of the SH wave and the fundamental mode S0, that is, the symmetric mode, of the Lamb wave are observed, which are large spurious responses with respect to the first order mode A1, that is, the anti-symmetric mode. On the other hand, from FIGS. 3A and 3B, it is found that although responses by the anti-symmetric mode A1 are observed, the fundamental mode SH0 of the SH wave and the fundamental mode S0 of the symmetric mode, which cause degradation in the attenuation band, are not significantly observed.

That is, since the piezoelectric thin film 3 has a twin crystal structure, it is found that undesired spurious responses are effectively suppressed.

The results shown in FIGS. 3B and 3C were obtained by a finite element method. In this preferred embodiment, when the wavelength of the IDT was represented by λ, the thickness of the $LiNbO_3$ thin film is set to about 0.155λ, the IDT electrode 4 was formed of Al, the thickness thereof is set to about 0.03λ, and the duty ratio is set to about 0.47. In addition, for the twin crystal structure, the piezoelectric thin film portion was equally divided into about 80 regions with respect to the elastic wave propagation direction, an Euler angle (0°, 0°, $\omega_0$) portion and an Euler angle (0°, 0°, $\omega_0+180°$) portion were alternately arranged, and $\psi_0$ is set to about 15°. In any propagation direction, the same results can be obtained as those obtained with respect to $\psi_0$.

In addition, although FIGS. 3A to 3C show the results when the piezoelectric thin film 3 was a $LiNbO_3$ thin film, when a $LiTaO_3$ thin film was used, similar results to those described above could be obtained.

Second Preferred Embodiment

Figure 4:
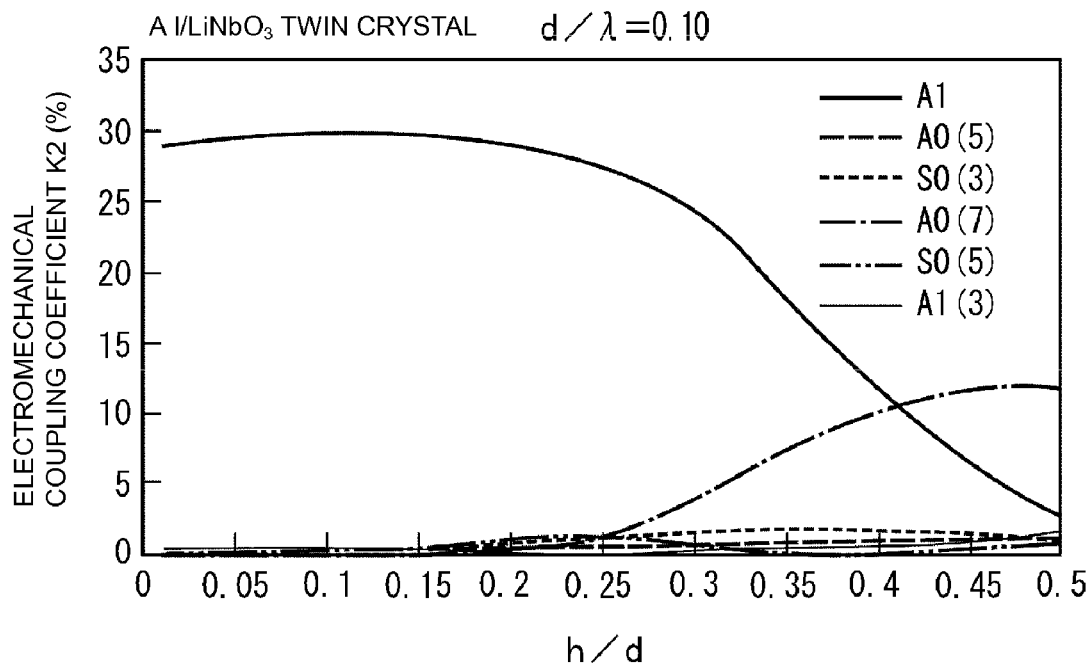
FIG. 4 is a view showing the change in electromechanical coupling coefficient $K^2$ with h/d of each mode in which in a Lamb wave device of a preferred embodiment of the present invention, an IDT electrode is provided on a $LiNbO_3$ thin film using Al, and the ratio d/λ is set to about 0.10.
Figure 5:
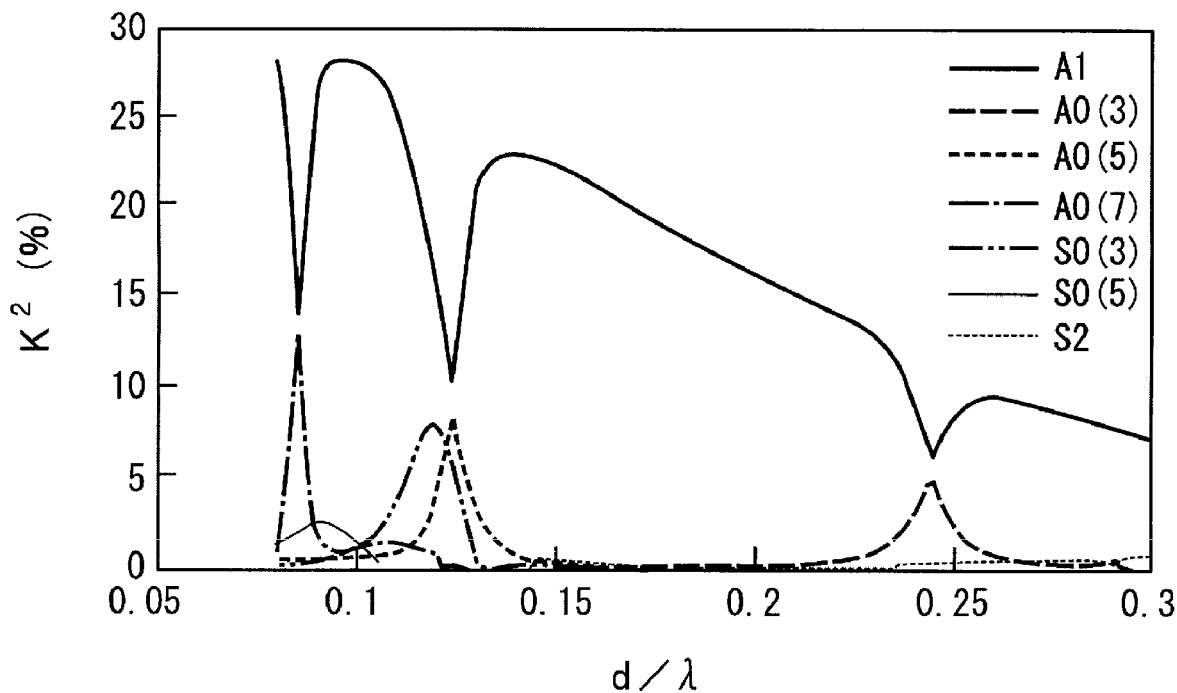
FIG. 5 is a view showing the change in electromechanical coupling coefficient $K^2$ of each mode of a Lamb wave when h/d is set to about 0.24, and the ratio d/λ is changed in the range of about 0.08 to about 0.3.

In a Lamb wave device similar to that in the first preferred embodiment, the electromechanical coupling coefficient of a Lamb wave was obtained when the thickness of the IDT electrode 4 and the thickness of the piezoelectric thin film 3 were variously changed. The results are shown in FIGS. 4 and 5. In FIGS. 4 and 5, h indicates the thickness of the IDT electrode, d indicates the thickness of the piezoelectric thin film, and X indicates the wavelength of a Lamb wave. In addition, for the calculation, a finite element method was used. FIG. 4 shows the change in electromechanical coupling coefficient of each mode of the Lamb wave with the change in h/d when d/λ is set to about 0.1. As shown in FIG. 4, it was found that when h/d exceeds approximately about 0.24, the electromechanical coupling coefficient $K^2$ of the A1 mode, which is the main mode, decreases, and that the electromechanical coupling coefficients of the other modes increase. Thus, it was found that when the upper limit of h/d is set to approximately about 0.24 when d/λ is set to about 0.1, a Lamb wave device which suppresses spurious responses is achieved.

In addition, the notation of the individual modes of the Lamb wave shown in FIG. 4 is as describe below. The mode of the Lamb wave is defined by Xn(i). That is, X indicates the type of mode, for example, A indicates the asymmetric mode, and S indicates the symmetric mode. In addition, "n" is an integer of 0 or more and indicates the order of the mode, that is, the number of nodes of the maximum displacement component in the thickness direction of the piezoelectric thin film. Furthermore, "i" is an integer of 1 or more and indicates the number of nodes of the maximum displacement component in a half-wavelength region in the propagation direction of the Lamb wave. In particular, when "i" is 1, the notation of (i) is omitted.

Next, the change in electromechanical coupling coefficient $K^2$ of each mode is shown when d/λ was changed. FIG. 5 is a view showing the change in electromechanical coupling coefficient $K^2$ of each mode of the Lamb wave when h/d was fixed at about 0.24 and d/λ was changed in the range of about 0.08 to about 0.3. As shown in FIG. 5, it was found that in several ranges of d/λ, the electromechanical coupling coefficient $K^2$ of the A1 mode, which is the main mode, decreases, and the electromechanical coupling coefficients $K^2$ of the other modes increase. These ranges of d/λ as described above are not suitable for filters.

When the results shown in FIGS. 4 and 5 are collectively studied, in the case in which h/d≦0.24 is maintained, and d/λ is within the range that satisfies the following I to III conditions:

$$0.090 \leq d/\lambda \leq 0.107 \quad \text{I}$$

$$0.133 \leq d/\lambda \leq 0.233 \quad \text{II}$$

$$0.257 \leq d/\lambda \leq 0.300, \quad \text{III}$$

the electromechanical coupling coefficient of the modes other than the A1 mode, which is the main mode, can be sufficiently suppressed, and as a result, the generation of spurious responses is suppressed, so that a Lamb wave device having desirable properties is provided. In addition, instead of Al used as a material for the IDT electrode, the same results as described above can be obtained when an alloy including Al as a primary component is used. When h/d is less than about 0.01, due to the actual loss in an electric current concomitant with an increase in an electrical resistance of the electrode, the insertion loss is degraded. Thus, h/d is preferably at least about 0.01.

Third Preferred Embodiment

Figure 6:
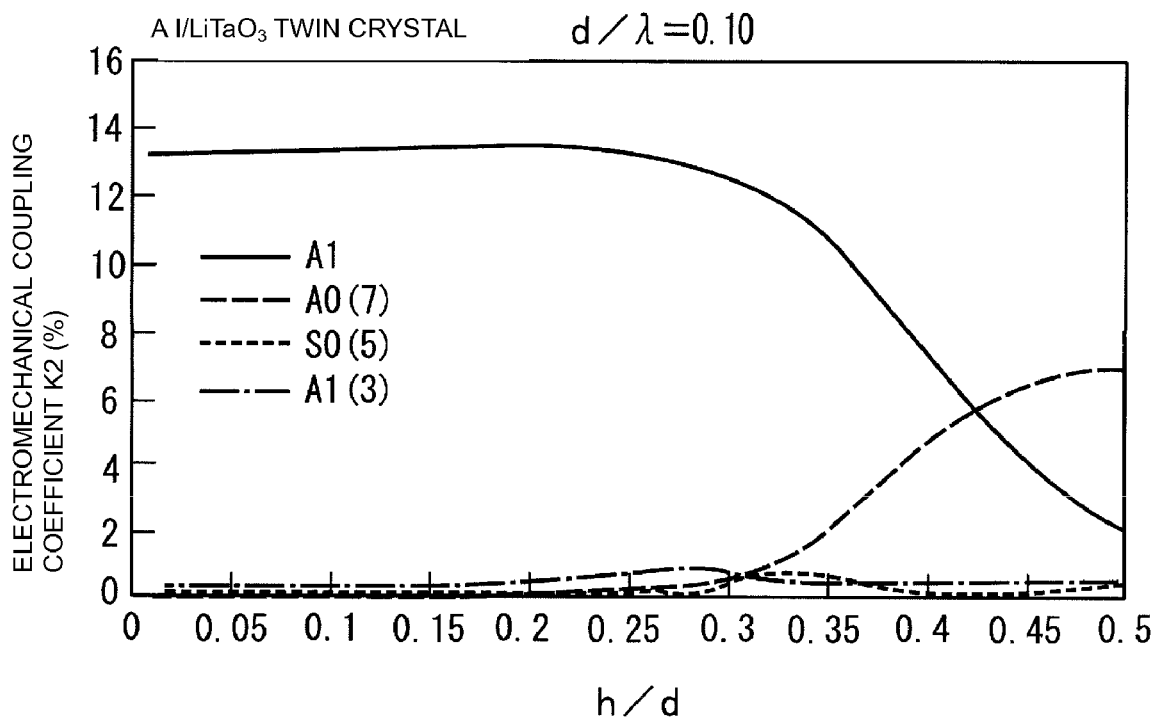
FIG. 6 is a view showing the change in electromechanical coupling coefficient $K^2$ with h/d of each mode in which in a Lamb wave device of a preferred embodiment of the present invention, the IDT electrode is provided on a $LiTaO_3$ thin film using Al, and the ratio d/λ is set to about 0.10.

In the third preferred embodiment, a basic structure similar to that of the first preferred embodiment was prepared except that the base substrate 2 and the piezoelectric thin film 3 of the Lamb wave device of the first preferred embodiment were formed of LiTaO$_3$. As in the preferred embodiment, the electromechanical coupling coefficient of a Lamb wave was obtained when the thickness of the IDT electrode 4 and that of the piezoelectric thin film 3 were variously changed. The results are shown in FIGS. 6 and 7. Similar to FIGS. 4 and 5, in FIGS. 6 and 7, h indicates the thickness of the IDT electrode, d indicates the thickness of the piezoelectric thin film, and λ indicates the wavelength of the Lamb wave. In addition, for the calculation, a finite element method was used. FIG. 6 shows the change in electromechanical coupling coefficient of each mode of the Lamb wave with the change in h/d when d/λ is set to about 0.1. As shown in FIG. 6, it was found that when h/d exceeds approximately about 0.26, the electromechanical coupling coefficient K$^2$ of the A1 mode, which is the main mode, decreases, and the electromechanical coupling coefficients K$^2$ of the other modes increase.

Next, the change in electromechanical coupling coefficient of each mode is shown when d/λ was changed. FIG. 7 is a view showing the change in electromechanical coupling coefficient K$^2$ of each mode of the Lamb wave when h/d was fixed at about 0.26 and d/λ was changed in the range of about 0.08 to about 0.3. As shown in FIG. 7, it was found that in several ranges of d/λ, the electromechanical coupling coefficient K$^2$ of the A1 mode, which is the main mode, decreases, and the electromechanical coupling coefficients K$^2$ of the other modes increase. These ranges of d/λ as described above are not suitable for filters.

When the results shown in FIGS. 6 and 7 are collectively studied, in the case in which h/d≦0.26 is maintained, and d/λ is within the range that satisfies the following IV to VI conditions:

$$0.093 \leq d/\lambda \leq 0.125 \quad \text{IV}$$

$$0.141 \leq d/\lambda \leq 0.240 \quad \text{V}$$

$$0.260 \leq d/\lambda \leq 0.300, \quad \text{VI}$$

the electromechanical coupling coefficient of the modes other than the A1 mode, which is the main mode, can be sufficiently suppressed, and as a result, the generation of spurious responses is suppressed, so that a Lamb wave device having desirable properties is provided. In addition, instead of Al used as a material for the IDT electrode, the same results as described above can be obtained when an alloy including Al as a primary component is used. When h/d is less than about 0.01, due to the actual loss in an electric current concomitant with an increase in an electrical resistance of the electrode, the insertion loss is degraded. Thus, h/d is preferably at least about 0.01.

In addition, in the Lamb wave device 1 shown in FIG. 1, the IDT electrode 4 is provided on the second surface 3b of the piezoelectric thin film 3. In this case, since the IDT electrode 4 is provided on the upper surface of the piezoelectric thin film 3, that is, on the surface exposed to the outside, the IDT electrode 4 can be easily formed. Thus, an inexpensive Lamb wave device 1 can be produced.

Furthermore, the IDT electrode 4 may be provided on the first surface 3a of the piezoelectric thin film 3, that is, on the inside surface facing the base substrate 2. When the IDT electrode 4 is provided on the first surface 3a, which is the inside surface facing the space A, even when a metal powder separated from a metal exterior packaging case falls, short-circuiting and/or property defects are not likely to occur. Thus, a Lamb wave device which is not likely to be varied by adhesion of a metal powder and which has superior environmental resistance, such as humidity resistance, can be provided.

In addition, in this specification, the twin crystal is defined as one solid in which at least two single crystals of one substance are bonded to each other in accordance with a specific symmetric relationship. The rotation twin crystal having the c-axis that functions as the rotation axis is defined as a twin crystal having a symmetric relationship which can be represented such that, when individual single crystals, that is, constituent elements, are represented by Euler angles, the Euler angles rotate to each other around the c axis.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A Lamb wave device comprising:
   a base substrate;
   a piezoelectric thin film provided on the base substrate and including a floating portion floating above the base substrate, the floating portion having a first surface facing the base substrate and a second surface opposite to the first surface; and
   an IDT electrode disposed on at least one of the first and the second surfaces of the piezoelectric thin film; wherein
   the piezoelectric thin film is made of one of LiTaO$_3$ and LiNbO$_3$; and
   a c-axis of the piezoelectric thin film is set in approximately the same direction as that of a substantially perpendicular line to the first and the second surfaces of the piezoelectric thin film, and the crystal structure of the piezoelectric thin film is a rotation twin crystal having the c-axis functioning as the rotation axis.

2. The Lamb wave device according to claim 1, wherein the piezoelectric thin film is made of LiNbO$_3$;
   the IDT electrode is made of one of Al and an alloy including Al as a primary component; and
   when the thickness of the IDT electrode is represented by h, the thickness of the piezoelectric thin film is represented by d, and the wavelength of a usage mode of the Lamb wave is represented by λ, h and d satisfy one of the following conditions I to III:

$0.01 \leq h/d \leq 0.24$ and $0.090 \leq d/\lambda \leq 0.107$  I $0.01 \leq h/d \leq 0.24$ and $0.133 \leq d/\lambda \leq 0.233$  II $0.01 \leq h/d \leq 0.24$ and $0.257 \leq d/\lambda \leq 0.300$.  III 3. The Lamb wave device according to claim 1, wherein the piezoelectric thin film is made of LiTaO$_3$;

the IDT electrode is made of one of Al and an alloy including Al as a primary component; and when the thickness of the IDT electrode is represented by h, the thickness of the piezoelectric thin film is represented by d, and the wavelength of a usage mode of the Lamb wave is represented by $\lambda$, h and d satisfy one of the following conditions IV to VI:

$0.01 \leq h/d \leq 0.26$ and $0.093 \leq d/\lambda \leq 0.125$  IV $0.01 \leq h/d \leq 0.26$ and $0.141 \leq d/\lambda \leq 0.240$  V $0.01 \leq h/d \leq 0.26$ and $0.260 \leq d/\lambda \leq 0.300$.  VI 4. The Lamb wave device according to claim 1, wherein the IDT electrode is disposed on the second surface of the piezoelectric thin film.

5. The Lamb wave device according to claim 1, wherein the IDT electrode is disposed on the first surface of the piezoelectric thin film.

* * * * *